United States Patent
Huang et al.

(10) Patent No.: US 6,856,015 B1
(45) Date of Patent: Feb. 15, 2005

(54) SEMICONDUCTOR PACKAGE WITH HEAT SINK

(75) Inventors: Chien-Ping Huang, Taichung Hsien (TW); Cheng-Hsu Hsiao, Taichung Hsien (TW); Shih-Kuang Chiu, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/719,726

(22) Filed: Nov. 21, 2003

(30) Foreign Application Priority Data

Aug. 21, 2003 (TW) ........................................ 92122954 A

(51) Int. Cl.$^7$ .............................................. H01L 23/12
(52) U.S. Cl. ...................... 257/706; 257/704; 257/705; 257/730; 257/731; 257/783
(58) Field of Search .................... 257/704, 705, 257/706, 731, 732, 733, 783

(56) References Cited

U.S. PATENT DOCUMENTS

| | | | |
|---|---|---|---|
| 5,311,402 A | 5/1994 | Kobayashi et al. | 361/760 |
| 5,369,403 A | 11/1994 | Temes et al. | 341/143 |
| 5,637,920 A | 6/1997 | Loo | 257/700 |
| 5,889,323 A * | 3/1999 | Tachibana | 257/704 |
| 5,926,371 A | 7/1999 | Dolbear | 361/704 |
| 5,931,222 A | 8/1999 | Toy et al. | 165/803 |
| 6,011,304 A | 1/2000 | Mertol | 257/706 |
| 6,093,961 A | 7/2000 | McCullough | 257/718 |
| 6,282,096 B1 * | 8/2001 | Lo et al. | 361/704 |
| 6,441,485 B1 | 8/2002 | Glenn | 257/706 |
| 6,509,636 B1 * | 1/2003 | Tsai et al. | 257/678 |
| 6,552,266 B2 * | 4/2003 | Carden et al. | 174/52.4 |
| 6,747,346 B2 * | 6/2004 | Saito et al. | 257/684 |

FOREIGN PATENT DOCUMENTS

| | | | | |
|---|---|---|---|---|
| JP | 1-161736 | * | 6/1989 | 257/704 |
| JP | 2-58354 | * | 2/1990 | 257/704 |
| JP | 3-105950 | * | 5/1991 | 257/704 |

* cited by examiner

*Primary Examiner*—Jasmine Clark
(74) *Attorney, Agent, or Firm*—Peter F. Corless; Steven M. Jensen; Edwards & Angell, LLP

(57) ABSTRACT

A semiconductor package includes a substrate having a top surface and a bottom surface; at least one chip mounted on the top surface of the substrate and electrically connected to the substrate; a heat sink attached to the top surface of the substrate by an adhesive material applied therebetween; and a plurality of solder balls implanted on the bottom surface of the substrate. The heat sink has a flat portion and a support portion connected to the flat portion. The support portion has at least one recess portion facing toward the top surface of the substrate and at least one burr formed on an interior surface of the recess portion such that the adhesive material can fill the recess portion and submerge the burr to provide an anchoring effect to firmly secure the heat sink in position on the substrate.

20 Claims, 11 Drawing Sheets

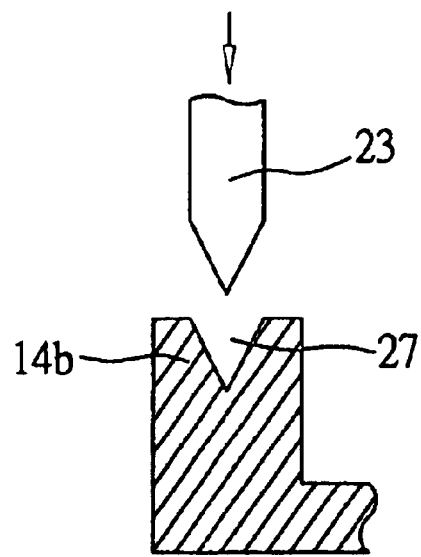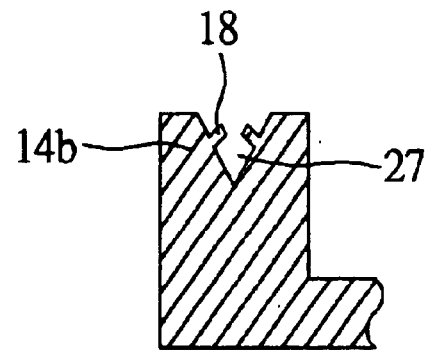
FIG. 7A  FIG. 7B
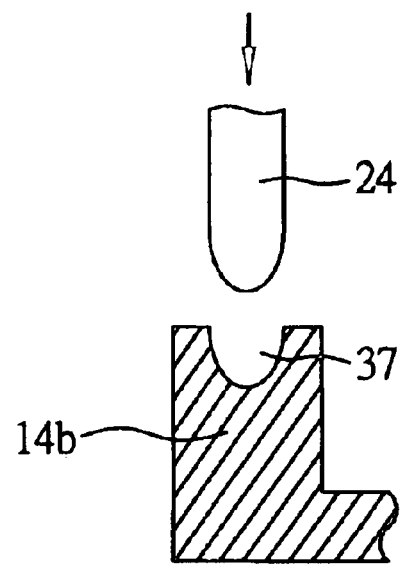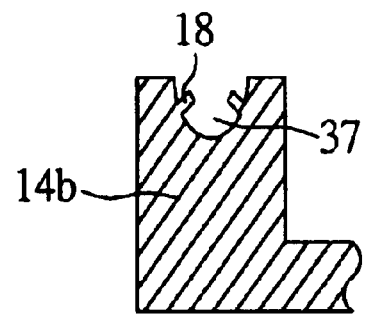
FIG. 8A  FIG. 8B

SEMICONDUCTOR PACKAGE WITH HEAT SINK

FIELD OF THE INVENTION

The present invention relates to semiconductor packages, and more particularly, to a semiconductor package with a heat sink for improving heat dissipating efficiency of the semiconductor package.

BACKGROUND OF THE INVENTION

A FCBGA (flip-chip ball grid array) semiconductor package is formed with both a flip-chip structure and a ball grid array in which at least one chip is mounted and electrically connected to a surface of a substrate by a plurality of solder bumps, and a plurality of solder balls are implanted on an opposite surface of the substrate to serve as input/output (I/O) connections of the semiconductor package. In order to dissipate heat produced from operation of the chip, a heat sink is usually incorporated in the semiconductor package, as disclosed by U.S. Pat. Nos. 5,311,402, 5,637,920, 5,931,222 and 6,011,304. This heat sink is attached to the substrate by means of an adhesive or solder and is usually greater in surface area than the chip, such that the heat sink covers the chip and effectively dissipates the heat from the chip. Besides the heat sink, at least one passive component can also be mounted on the substrate to enhance electrical performances of the semiconductor package. However, the provision of passive component undesirably decreases area on the substrate available for contact with the heat sink, making the heat sink relatively difficult to be firmly adhered and positioned onto the substrate and thereby leading to dislocation of the heat sink. This situation becomes severe in the use of a large heat sink. Moreover, attachment between the heat sink and the substrate via the adhesive or solder would be damaged by unsatisfactory cleanness of contact surfaces between the heat sink and the substrate, or by undesirable stress applied to the heat sink and the substrate. In this case, delamination may occur at an interface between the heat sink and the substrate and results in dislocation of the heat sink. When the substrate mounted with the heat sink is subject to external force such as vibration or shock, the heat sink may also be dislocated from the substrate.

To solve the above dislocation problem, U.S. Pat. No. 6,093,961 teaches to mount a heat sink on a chip and mechanically secure the heat sink in position. Referring to FIG. 11, the heat sink 50 is directly stacked on and coupled to the chip (flip chip) 52 on a substrate 53. The heat sink 50 is formed with a plurality of flexible legs 51 extending toward the chip 52, each leg 51 having a hook end. When the heat sink 50 is pressed on a top surface 53 of the chip 52, the hook ends of the flexible legs 51 are adapted to be engaged with underside corners of the chip 52, such that the heat sink 50 is securely disposed on the chip 52. However, this structure is defective in that the chip 52 may be damaged if improperly pressing the heat sink 10 on the chip 52. Further, during a high temperature process or thermal cycle, due to mismatch in coefficient of thermal expansion (CTE) between the heat sink 10 and the chip 52, the chip 52 may suffer thermal stress and crack.

Referring to FIG. 12, U.S. Pat. Nos. 5,396,403 and 5,926,371 propose to position a heat sink 60 on a substrate 61 in a mechanical manner that the heat sink 60 is formed with a plurality of holes 62 at positions supposed to be in contact with the substrate 61 that is also formed with a plurality of corresponding holes 63, and a plurality of fixing members 64 such as bolts are used to couple the corresponding pairs of holes 62, 63 and thereby connect the heat sink 60 and the substrate 61. Moreover, referring to FIG. 13, in U.S. Pat. No. 6,441,485, extending portions 71 with hook ends are formed at edges of a heat sink 70, allowing the hook ends to be inserted into corresponding holes 73 formed in a substrate 72, thereby secure the heat sink 70 to the substrate 72.

However, the above mechanical methods of using the fixing members or extending portions for securing the heat sink to the substrate render significant problems. One is that a portion of area on the substrate is predetermined for use to form the holes, which affects circuit layout on the substrate and makes the substrate not able to be mounted with a full array of solder balls. Formation of the holes undesirably increases fabrication costs and process complexity of the substrate. And external moisture or contaminant may enter the holes of the substrate and degrade reliability of fabricated products.

Referring to FIG. 14, in order to improve attachment between a heat sink 80 and a substrate 81, at least one groove 82 is formed on a contact surface of the heat sink 80 for providing more contact area between the heat sink 80 and an adhesive material 83 used to attach the heat sink 80 to the substrate 81. Unfortunately, in practice, the heat sink 80 cannot be effectively securely attached to the substrate 81 only by means of the groove 82.

FIG. 15 shows a semiconductor package with a heat sink 90 having at least one modified groove 91. The groove 91 is shaped as a reverse trapezoid such that an adhesive material 92 received therein is capable of providing an anchoring effect to enhance the attachment between the heat sink 90 and a substrate 93. However, it is technically difficult to form the reverse-trapezoid groove 91 on a contact surface of the heat sink 90.

Therefore, the problem to be solved herein is to enhance adhesion between a heat sink and a substrate to securely position the heat sink on the substrate without damaging a chip mounted on the substrate or affecting circuit layout on the substrate.

SUMMARY OF THE INVENTION

In view of the above prior-art drawbacks, an objective of the present invention is to provide a semiconductor package with a heat sink, wherein the heat sink is formed with at least one burr at a position where an adhesive material for attaching the heat sink to a substrate can submerge the burr, so as to increase the contact area between the heat sink and the adhesive material, making the adhesive material provide an anchoring effect to firmly secure the heat sink to the substrate.

Another objective of the present invention is to provide a semiconductor package with a heat sink, wherein the heat sink is formed with at least one recess portion at a position in contact with the substrate, and at least one burr is formed on an interior surface of the recess portion; by provision of the recess portion and the burr, the contact area between the heat sink and the adhesive material for attaching the heat sink to the substrate is further increased, and the anchoring effect from the adhesive material is enhanced to firmly secure the heat sink on the substrate in position.

A further objective of the invention is to provide a semiconductor package with a heat sink, wherein the heat sink is attached to the substrate by the adhesive material, which does not require formation of holes on the substrate, thereby not affecting circuit layout or solder ball arrangement on the substrate, and which would not lead to cracks of a chip mounted on the substrate.

In order to achieve the foregoing and other objectives, the present invention proposes a semiconductor package according to a preferred embodiment includes a substrate having a top surface and a bottom surface; at least one chip mounted on the top surface of the substrate and electrically connected to the substrate; the heat sink mounted on the top surface of the substrate for covering the chip, the heat sink having a flat portion and a support portion connected to the flat portion, wherein the support portion has at least one recess portion facing toward the top surface of the substrate, and at least one burr is formed on an interior surface of the recess portion; an adhesive material applied between the support portion of the heat sink and the top surface of the substrate to fill the recess portion and submerge the burr, so as to attach the heat sink to the substrate by means of the adhesive material; and a plurality of solder balls implanted on the bottom surface of the substrate.

In another embodiment of the present invention, instead of forming the recess portion described above, the support portion of the heat sink has a contact surface in contact with the top surface of the substrate, and the at least one burr is formed on a surface of the support portion other than the contact surface, wherein the surface with the burr is an inner surface of the support portion that faces toward the chip. The adhesive material is applied between the support portion of the heat sink and the top surface of the substrate and submerges the burr to attach the heat sink to the substrate.

The above semiconductor packages according to the invention yield significant benefits in the use of a heat sink formed with at least one burr at a position where an adhesive material for attaching the heat sink to a substrate can submerge the burr. In particular, the heat sink is composed of a flat portion and a support portion, wherein the flat portion is elevated above a chip mounted on the substrate, and the support portion is attached to the substrate by the adhesive material. The burr is located on an inner surface of the support portion that faces toward the chip, and can be submerged by the adhesive material, thereby increasing the contact area between the heat sink and the adhesive material, and making the adhesive material provide an anchoring effect to firmly secure the heat sink to the substrate. Besides, the support portion of the heat sink can be formed with a recess portion at a position in contact with the substrate, and at least one burr is located on an interior surface of the recess portion. The recess portion can be a groove or blind cavity. The adhesive material applied between the support portion and the heat sink can fill the recess portion and submerge the burr. The provision of the recess portion and the burr further increases the contact area between the heat sink and the adhesive material, thereby enhancing the anchoring effect from the adhesive material to allow the heat sink to be strongly held on the substrate in position. Therefore, there is no need to form prior-art holes on the substrate for accommodating fixing members such as bolts used to connect the heat sink and the substrate, such that circuit layout and solder ball arrangement on the substrate would not be adversely affected, and thus the substrate can be desirably implanted with a full array of solder balls. Moreover, the substrate free of holes prevents the entrance of external moisture or contaminant and thereby eliminates reliability issues. In addition, the heat sink is mounted on the substrate instead of on the chip, thereby preventing chip cracks that occur in the prior art with the heat sink directly stacked on the chip.

BRIEF DESCRIPTION OF THE DRAWINGS

The present invention can be more fully understood by reading the following detailed description of the preferred embodiments, with reference made to the accompanying drawings, wherein:

FIGS. 7A and 7B are cross-sectional views showing formation of the recess portion, according to another preferred embodiment, in the present invention;

FIGS. 8A and 8B are cross-sectional views showing formation of the recess portion, according to a further preferred embodiment, in the present invention;

DETAILED DESCRIPTION OF THE PREFERRED EMBODIMENTS

Preferred embodiments of a semiconductor package with a heat sink according to the present invention are described in detail with references to FIGS. 1 through 10.

Figure 1A:
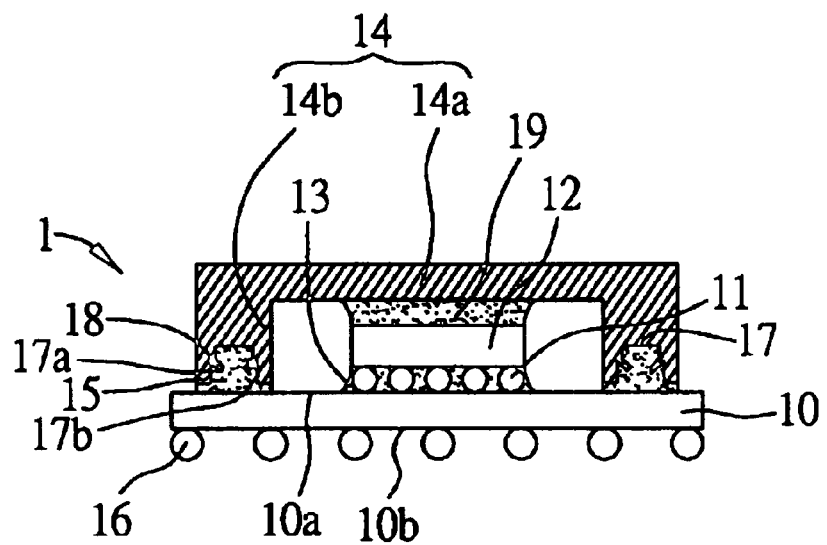
FIG. 1A is a schematic cross-sectional view of a semiconductor package according to a preferred embodiment of the present invention.
Figure 1B:
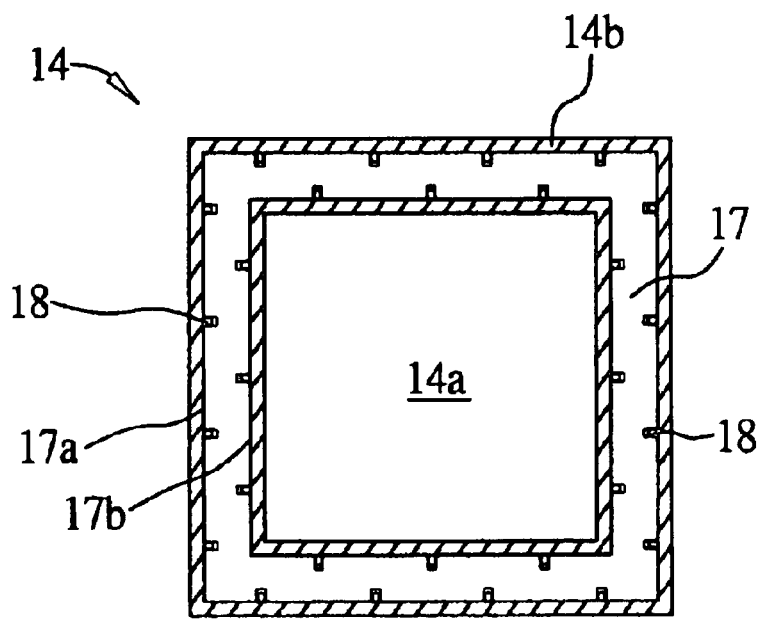
FIG. 1B is a bottom view of a heat sink used in the semiconductor package of FIG. 1A.

FIGS. 1A and 1B show the semiconductor package 1 according to a preferred embodiment of the invention. As shown in the drawings, this semiconductor package 1 uses a substrate 10 as a chip carrier primarily made of a conventional resin material such as epoxy resin, polyimide resin, BT (Bismaleimide Triazine) resin, FR4 resin, etc.

The substrate 10 has a top surface 10a and a bottom surface 10b. The top surface 10a of the substrate 10 is formed with a plurality of bond pads (not shown) at predetermined positions where solder bumps 11 are bonded, and the bottom surface 10b of the substrate 10 is formed with a plurality of ball pads (not shown) for being implanted with solder baits 16. The substrate 10 is fabricated by conventional processes that are not to be further detailed herein.

At least one chip 12 is prepared, having an active surface where electronic elements and circuits (not shown) are disposed and a non-active surface opposed to the active surface. The active surface of the chip 12 is formed with a plurality of bond pads (not shown) corresponding in position to the bond pads of the substrate 10, such that the solder bumps 11 can be bonded to the bond pads respectively on the chip 12 and on the substrate 10 to electrically connect the active surface of the chip 12 to the top surface 10a of the substrate 10. The use of solder bumps 11 for mediating chip-substrate electrical connection is customarily named flip-chip technology, which can beneficially shorten the electrical connection pathway between the chip 12 and the substrate 10 and thereby assure quality of electrical performances.

It is preferable to apply an insulating material 13 (such as resin, etc.) between the chip 12 and the substrate 10 to fill gaps between adjacent solder bumps 11 and encapsulate the solder bumps 11 so as to enhance the bondability between the chip 12 and the substrate 10. This gap-filling method is customarily referred to as underfill technique, which can be performed by dispensing the insulating material 13 and allowing the insulating material 13 to fill the gaps between adjacent solder bumps 11 by virtue of capillarity; the underfill technique is well known in the art and not to be further described herein.

Moreover, optionally at least one passive component (not shown) (such as capacitor, etc.) can be mounted on the top surface 10a of the substrate 10 at area free from the solder bumps 11 or chip 12 to improve electrical performances of the semiconductor package 1.

A heat sink 14 is provided on the top surface 10a of the substrate 10 and the non-active surface of the chip 12. The heat sink 14 is composed of a flat portion 14a and a support portion 14b connected to the flat portion 14a. The support portion 14b of the heat sink 14 is attached to the top surface 10a of the substrate 10 by means of an adhesive material 15. The flat portion 14a of the heat sink 14 can be attached to the non-active surface of the chip 12 by means of an adhesive 19 such as thermally conductive adhesive. The chip 12 and the passive component (not shown) are covered by the heat sink 14 and thus protected against damage from external moisture and contaminant. As a result, heat generated from the chip 12 can be dissipated via the thermally conductive adhesive 19 and the heat sink 14, thereby improving heat dissipating efficiency of the semiconductor package 1. The support portion 14b of the heat sink 14 connected to edges of the flat portion 14a can the flat portion 14a above the chip 12. The support portion 14b is formed with a recess portion 17 such as groove on a contact surface brought into contact with the top surface 10a of the substrate 10. As shown in FIG. 1B, the groove 17 is a single peripherally-situated throughout trench; it should be understood that more than one recess portions or grooves can be provided, or at least two symmetrically arranged grooves may be formed. A plurality of burrs 18 are formed on at least one interior surface of the groove 17, preferably on two opposite interior surfaces 17a, 17b of the groove 17. The burrs 18 can be evenly distributed and arranged in a stagger manner on the opposite interior surfaces 17a, 17b of the groove 17 with respect to each other.

Figure 2A:
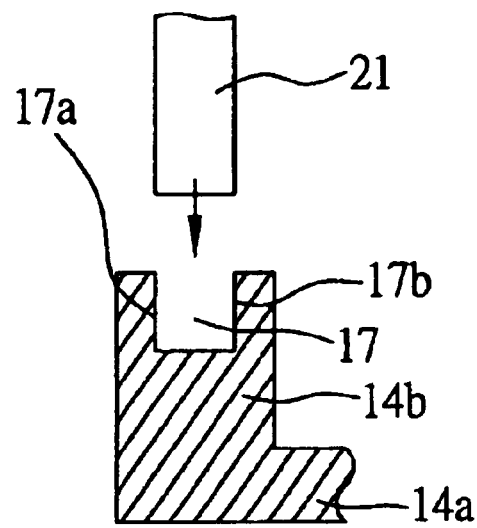
FIG. 2A is a cross-sectional view showing formation of a recess portion, according to a preferred embodiment, in the semiconductor package of FIG. 1A.
Figure 2B:
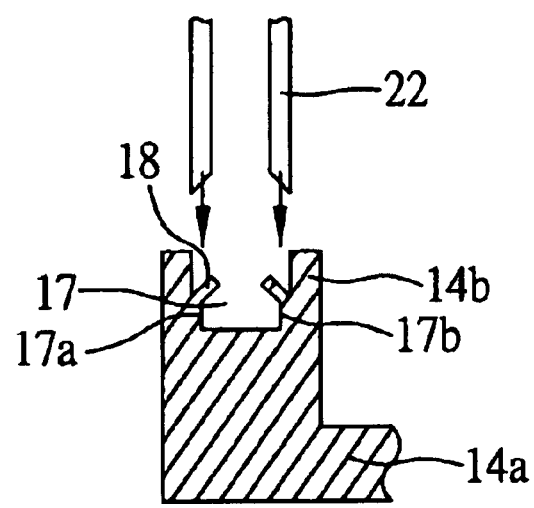
FIG. 2B is a cross-sectional view showing formation of burrs, according to a first preferred embodiment, in the semiconductor package of FIG. 1A.

Referring to FIGS. 2A and 2B, the groove 17 on the support portion 14b may be formed by a conventional stamping method using a punch 21 having a flat end. The burrs 18 may be formed by stamping with a punch 22 having a tapered top end. The burrs 18 generally extend toward the top surface 10a of the substrate 10 (FIG. 1A).

Figure 3:
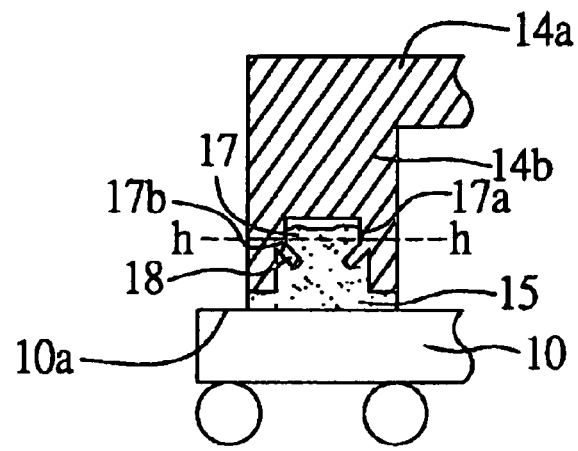
FIG. 3 is a partial cross-sectional view showing the heat sink attached to a substrate by means of an adhesive material in the semiconductor package of FIG. 1A.

Referring to FIG. 3, the adhesive material 15 such as adhesive or solder is applied between the support portion 14b of the heat sink 14 and the top surface 10a of the substrate 10. Appropriate pressure is exerted to allow the adhesive material 15 to substantially fill the groove 17 of the heat sink 14 to an extent that the adhesive material 15 reaches above the dash line h—h and submerges the burrs 18. A baking process is performed to cure the adhesive material 15. This adhesive material 15 filling the groove 17 and submerging the burrs 18 thereby provides an anchoring effect to firmly secure the support portion 14b of the heat sink 14 to the top surface 10a of the substrate 10.

Referring further to FIG. 1A, the plurality of solder balls 16 are implanted at the ball pads on the bottom surface 10b of the substrate 10 and serve as input/output (I/O) connections to allow the chip 12 to be electrically connected to an external device such as printed circuit board (not shown). This thereby completes fabrication of the semiconductor package 1 according to this preferred embodiment of the invention, and the semiconductor package 1 is a FCBGA (flip-chip ball grid array) package.

In this embodiment, the groove 17 would not be exposed on the appearance of the heat sink 14 attached to the substrate 10, thereby not affecting the overall external profile of the semiconductor package 1. Moreover, application of the adhesive material 15 between the heat sink 14 and the substrate 10 adopts conventional technology, thereby not increasing fabrication costs and process complexity.

Figure 4:
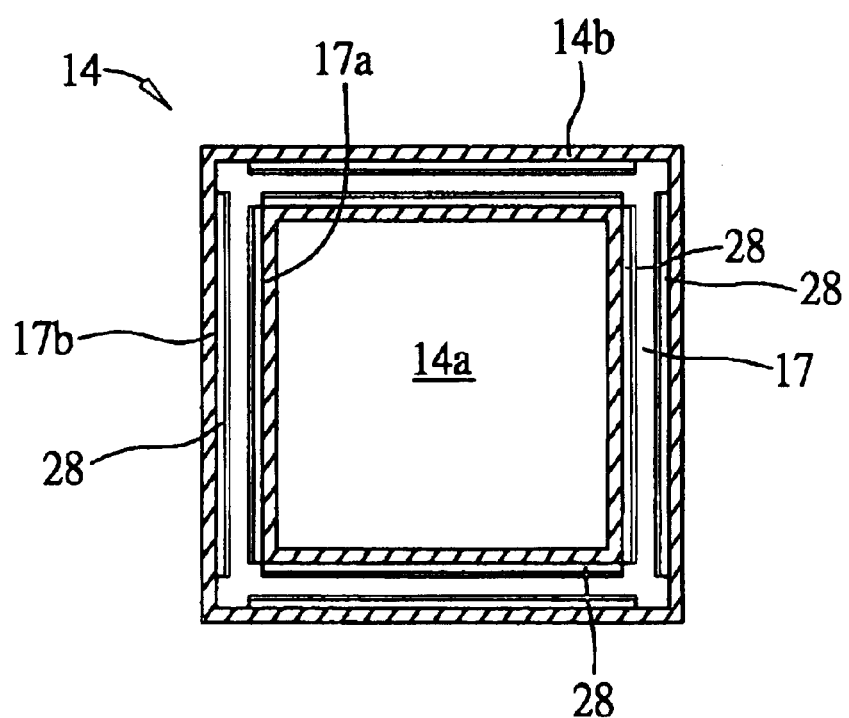
FIG. 4 is a bottom view of the heat sink showing the burrs, according to a second preferred embodiment, in the present invention.

FIG. 4 shows a second preferred embodiment of burrs 28 formed on the heat sink 14. As shown in the drawing, the burrs 28 on the support portion 14b of the heat sink 14 are each an elongated protrusion formed on one of the opposite interior surfaces 17a, 17b of the groove 17. Similar to the situation of FIG. 3, the adhesive material 15 (not shown in FIG. 4) applied between the support portion 14b of the heat sink 14 and the top surface 10a of the substrate 10 is allowed to submerge the elongated protrusions 28.

Figure 5A:
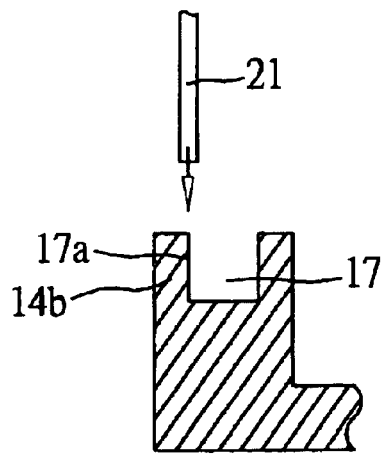
FIGS. 5A and 5B are cross-sectional views showing formation of the burr, according to a third preferred embodiment, in the present invention.
Figure 5B:
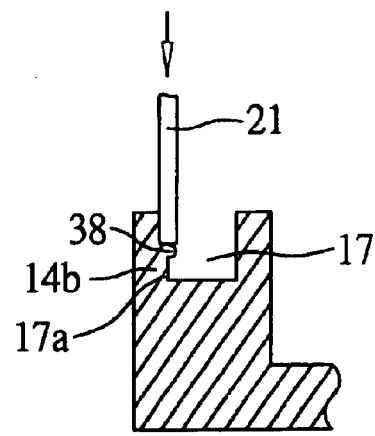

FIGS. 5A and 5B show formation of a burr 38 according to a third preferred embodiment. As shown in the drawings, this burr 38 can be formed by the punch 21 having a flat end, such that the burr 38 shaped as a protruding flange in the groove 17 extends laterally and is substantially perpendicular to the interior surface 17a of the support portion 14b of the heat sink 14. Similar to the situation of FIG. 3, the adhesive material 15 (not shown in FIGS. 5A and 5B) applied between the support portion 14b of the heat sink 14 and the top surface 10a of the substrate 10 is allowed to submerge the burr 38.

Figure 6A:
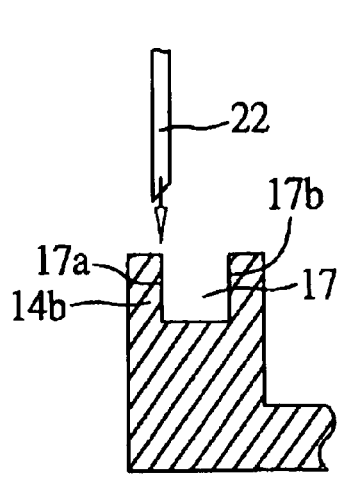
FIGS. 6A through 6C are cross-sectional views showing formation of the burr, according to a fourth preferred embodiment, in the present invention.
Figure 6B:
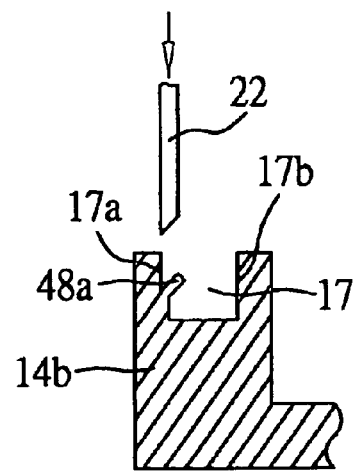
Figure 6C:
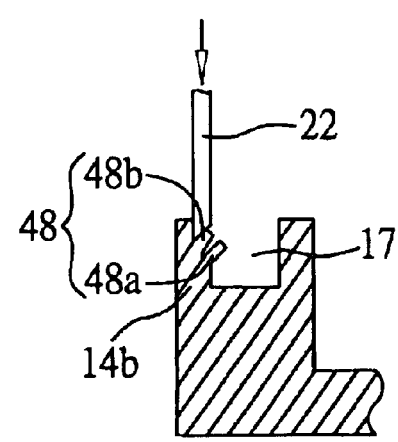

FIGS. 6A through 6C show formation of a burr 48 according to a fourth preferred embodiment. As shown in the drawings, this burr 48 is a binary protrusion having a first part 48a and a second part 48b on the interior surface 17a of the groove 17 on the support portion 14b of the heat sink 14, and is formed by stamping using a punch 22 having a beveled end by which the first part 48 of the burr is firstly made as shown in FIG. 6B and the second part 48b is then formed adjacent to the first part 48a as shown in FIG. 6C. This configuration of the burr 48 can significantly increase interfacial contact area between the heat sink 14 and the adhesive material 15, thereby improving the adhesion between the heat sink 14 and the substrate 10.

FIGS. 7A and 7B show formation of a recess portion or groove 27 according to a another preferred embodiment. This groove 27 is formed by stamping using a punch 23 having a tapered end on the support portion 14a of the heat sink 14 to have V-shaped cross-section.

FIGS. 8A and 8B show formation of a recess portion or groove 37 according to a further preferred embodiment of the invention. This groove 37 is formed by stamping using a punch 24 having a semispherical end on the support portion 14b of the heat sink 14 to have semicircular cross-section.

Figure 9A:
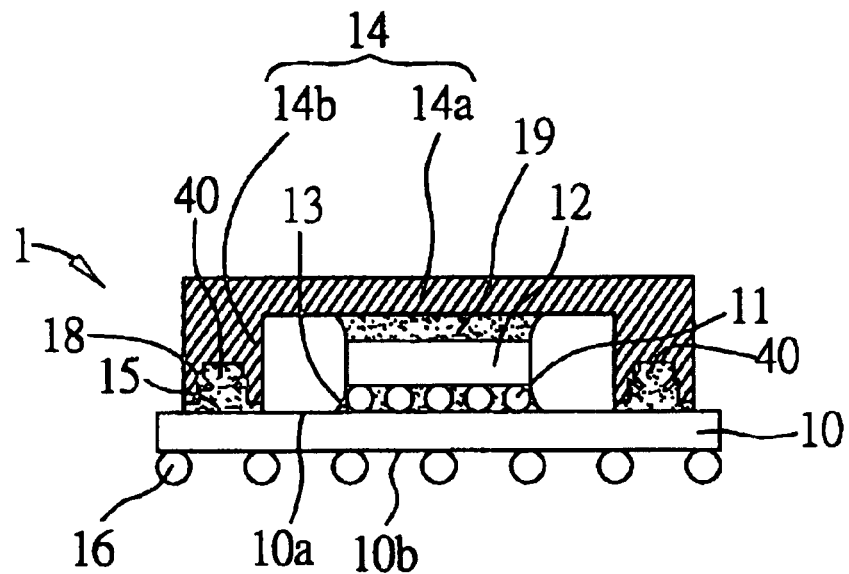
FIG. 9A is a cross-sectional view showing the semiconductor package according to another preferred embodiment of the present invention.
Figure 9B:
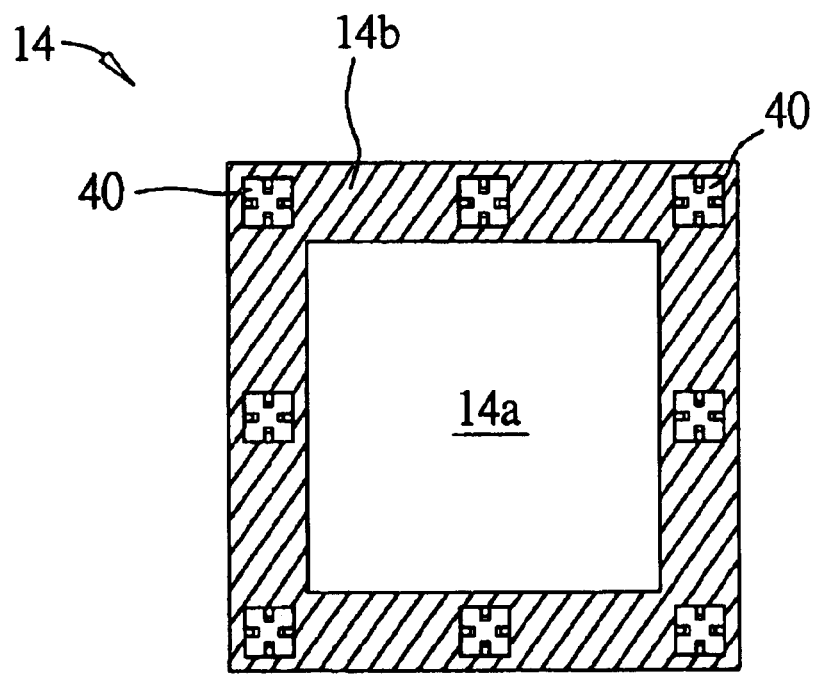
FIG. 9B is a bottom view of the heat sink used in the semiconductor package of FIG. 9A.

FIGS. 9A and 9B show the semiconductor package 1 according to another preferred embodiment of the invention. As shown in the drawings, this semiconductor package 1 is structurally similar to that shown in FIGS. 1A and 1B, except that the plurality of recess portions 40 formed on the support portion 14b of the heat sink 14 are blind cavities, and the burrs 18 are formed on the interior surfaces of the blind cavities 40. These blind cavities 40 are preferably evenly distributed and arranged symmetrically on the support portion 14b that is brought into contact with the top surface 10a of the substrate 10.

Figure 10:
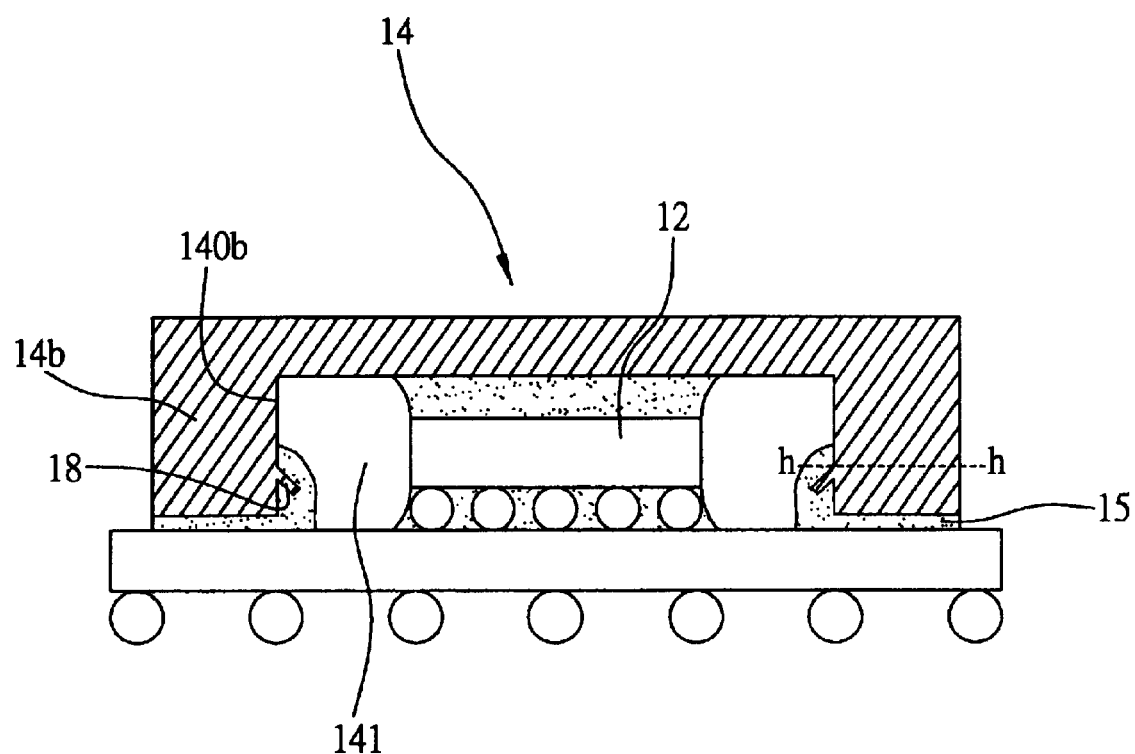
FIG. 10 is a cross-sectional view showing the semiconductor package according to a further embodiment of the present invention.
Figure 11:
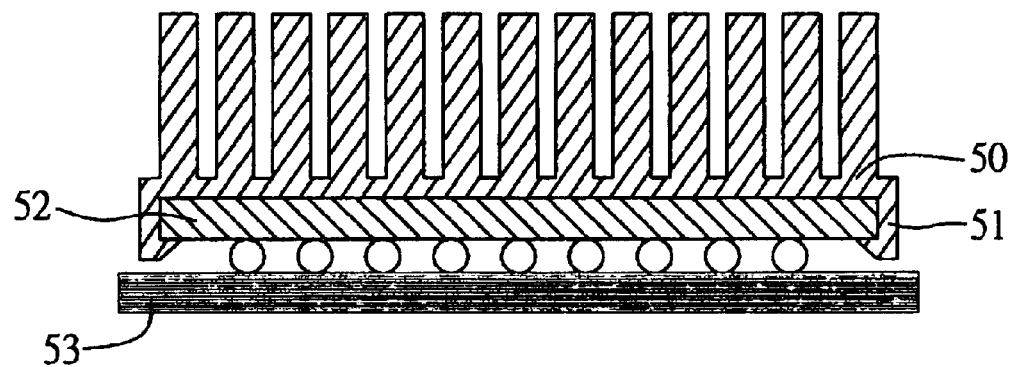
FIG. 11 (PRIOR ART) is a cross-sectional view of a semiconductor package disclosed in U.S. Pat. No. 6,093,961.
Figure 12:
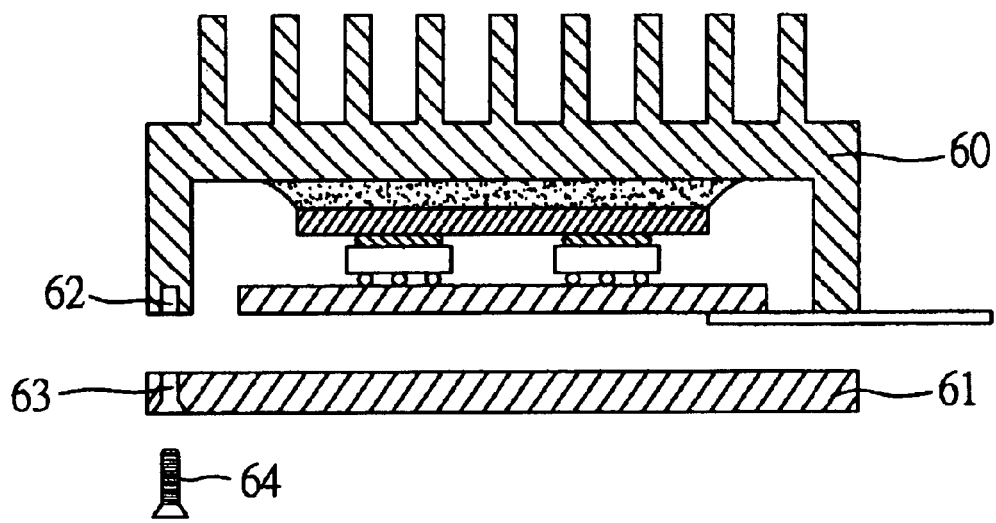
FIG. 12 (PRIOR ART) is a cross-sectional view of a semiconductor package disclosed in U.S. Pat. No. 5,396,403.
Figure 13:
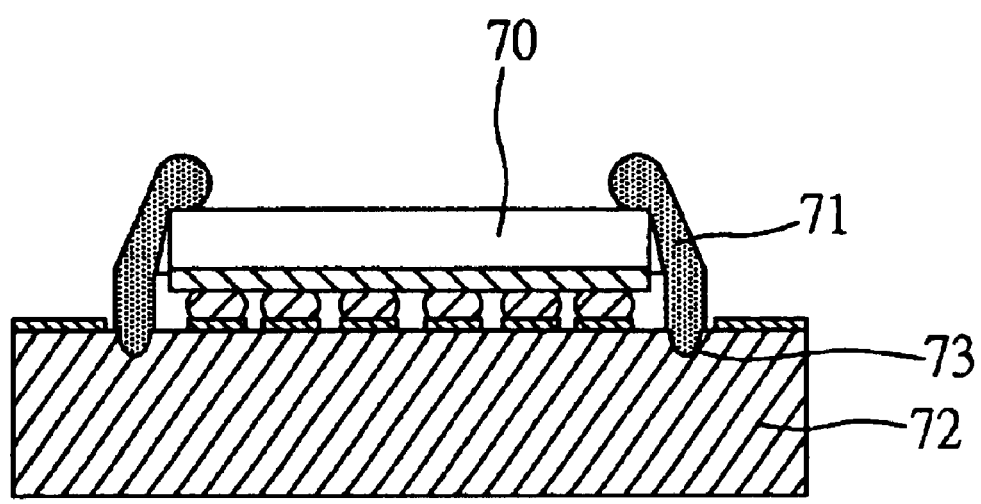
FIG. 13 (PRIOR ART) is a cross-sectional view of a semiconductor package disclosed in U.S. Pat. No. 6,441,485.
Figure 14:
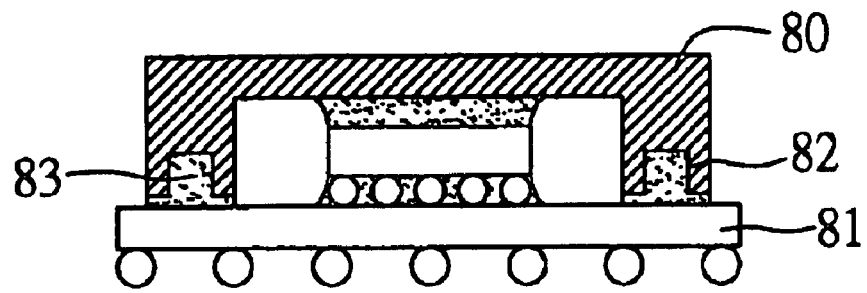
FIG. 14 (PRIOR ART) is a cross-sectional view of a conventional semiconductor package with a heat sink having at least one groove formed on a contact surface thereof.
Figure 15:
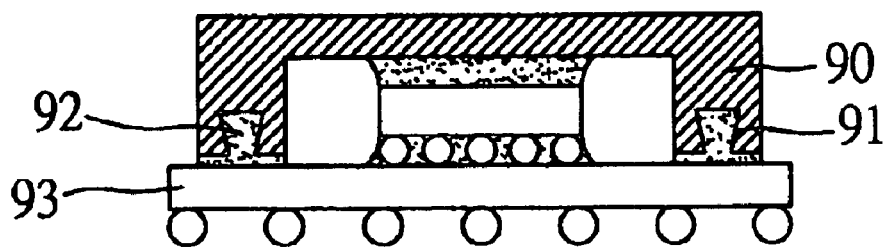
FIG. 15 (PRIOR ART) is a cross-sectional view of another conventional semiconductor package with a heat sink having at least one reverse-trapezoid groove formed thereon.

FIG. 10 shows the semiconductor package according to a further preferred embodiment of the invention. This semiconductor package structurally differs from those shown in FIGS. 1A, 1B, 9A and 9B in that, instead of forming the recess portions, the burrs 18 are formed on a surface of the support portion 14b of the heat sink 14 other than the contact surface thereof in contact with the top surface 10a of the substrate 10, and this surface with burrs 18 is an inner surface 140b of the support portion 14b that faces toward the chip 12; preferably the burrs 18 are located near the substrate 10 and may extend toward the substrate 10. The adhesive material 15 is applied between the support portion 14b of the heat sink 14 and the top surface 10a of the substrate 10 in an amount that the adhesive material 15 reaches above the dash line h—h when the heat sink 14 is pressed on the substrate 10, so as to allow the burrs 18 to be submerged by the adhesive material 15.

The above semiconductor packages according to the invention yield significant benefits in the use of a heat sink formed with at least one burr at a position where an adhesive material for attaching the heat sink to a substrate can submerge the burr. In particular, the heat sink is composed of a flat portion and a support portion, wherein the flat portion is elevated above a chip mounted on the substrate, and the support portion is attached to the substrate by the adhesive material. The burr is located on an inner surface of the support portion that faces toward the chip, and can be submerged by the adhesive material, thereby increasing the contact area between the heat sink and the adhesive material, and making the adhesive material provide an anchoring effect to firmly secure the heat sink to the substrate. Besides, the support portion of the heat sink can be formed with a recess portion at a position in contact with the substrate, and at least one burr is located on an interior surface of the recess portion. The recess portion can be a groove or blind cavity. The adhesive material applied between the support portion and the heat sink can fill the recess portion and submerge the burr. The provision of the recess portion and the burr further increases the contact area between the heat sink and the adhesive material, thereby enhancing the anchoring effect from the adhesive material to allow the heat sink to be strongly held on the substrate in position. Therefore, there is no need to form prior-art holes on the substrate for accommodating fixing members such as bolts used to connect the heat sink and the substrate, such that circuit layout and solder ball arrangement on the substrate would not be adversely affected, and thus the substrate can be desirably implanted with a full array of solder balls. Moreover, the substrate free of holes prevents the entrance of external moisture or contaminant and thereby eliminates reliability issues. In addition, the heat sink is mounted on the substrate instead of on the chip, thereby preventing chip cracks that occur in the prior art with the heat sink directly stacked on the chip.

The invention has been described using exemplary preferred embodiments. However, it is to be understood that the scope of the invention is not limited to the disclosed embodiments. On the contrary, it is intended to cover various modifications and similar arrangements. For example, the substrate can also be a semiconductor substrate or chip formed with the pad for bump connection. The scope of the claims, therefore, should be accorded the broadest interpretation so as to encompass all such modifications and similar arrangements.

What is claimed is:

1. A semiconductor package with a heat sink, comprising:
   a substrate having a top surface and a bottom surface;
   at least one chip mounted on the top surface of the substrate and electrically connected to the substrate;
   the heat sink mounted on the top surface of the substrate for covering the chip, the heat sink having a flat portion and a support portion connected to the flat portion, wherein the support portion has at least one recess portion facing toward the top surface of the substrate, and at least one burr is formed on an interior surface of the recess portion;
   an adhesive material applied between the support portion of the heat sink and the top surface of the substrate to substantially fill the recess portion and submerge the burr, so as to attach the heat sink to the substrate by means of the adhesive material; and
   a plurality of solder balls implanted on the bottom surface of the substrate.

2. The semiconductor package as recited in claim 1, wherein the recess portion forms a groove.

3. The semiconductor package as recited in claim 1, wherein the recess portion forms a blind cavity.

4. The semiconductor package as recited in claim 1, wherein the burr is a protruding flange.

5. The semiconductor package as recited in claim 1, wherein the burr is a binary protrusion.

6. The semiconductor package as recited in claim 1, wherein the burr is an elongated protrusion.

7. The semiconductor package as recited in claim 1, wherein at least one of the burr is respectively formed on two opposite interior surfaces of the recess portion.

8. The semiconductor package as recited in claim 1, wherein the burr extends toward the top surface of the substrate.

9. The semiconductor package as recited in claim 1, wherein the recess portion has quadrate cross-section.

10. The semiconductor package as recited in claim 1, wherein the recess portion has V-shaped cross-section.

11. The semiconductor package as recited in claim 1, wherein the recess portion has semicircular cross-section.

12. The semiconductor package as recited in claim 1, further comprising: a thermally conductive adhesive applied between the chip and the flat portion of the heat sink.

13. The semiconductor package as recited in claim 1, which is a FCBGA (flip-chip ball grid array) package.

14. A semiconductor package with a heat sink, comprising:
- a substrate having a top surface and a bottom surface;
- at least one chip mounted on the top surface of the substrate and electrically connected to the substrate;
- the heat sink mounted on the top surface of the substrate for covering the chip, the heat sink having a flat portion and a support portion connected to the flat portion, wherein the support portion has a contact surface in contact with the top surface of the substrate, and at least one burr is formed on a surface of the support portion other than the contact surface;
- an adhesive material applied between the support portion of the heat sink and the top surface of the substrate and submerging the burr to attach the heat sink to the substrate; and
- a plurality of solder balls implanted on the bottom surface of the substrate.

15. The semiconductor package as recited in claim 14, wherein the burr is a protruding flange.

16. The semiconductor package as recited in claim 14, wherein the burr is a binary protrusion.

17. The semiconductor package as recited in claim 14, wherein the burr is an elongated protrusion.

18. The semiconductor package as recited in claim 14, wherein the surface with the burr is an inner surface of the support portion that faces toward the chip.

19. The semiconductor package as recited in claim 14, wherein the burr extends toward the top surface of the substrate.

20. The semiconductor package as recited in claim 14, further comprising: a thermally conductive adhesive applied between the chip and the flat portion of the heat sink.

* * * * *